US009991861B2

(12) United States Patent
Herberger et al.

(10) Patent No.: US 9,991,861 B2
(45) Date of Patent: Jun. 5, 2018

(54) SYSTEM AND METHOD FOR CONTROLLED DYNAMICS ADAPTATION FOR MUSICAL CONTENT

(71) Applicant: BELLEVUE INVESTMENTS GMBH & CO. KGAA, Berlin (DE)

(72) Inventors: Tilman Herberger, Dresden (DE); Titus Tost, Dresden (DE); Toni Engel, Dresden (DE)

(73) Assignee: BELLEVUE INVESTMENTS GMBH & CO. KGAA (DE)

( * ) Notice: Subject to any disclaimer, the term of this patent is extended or adjusted under 35 U.S.C. 154(b) by 561 days.

(21) Appl. No.: 13/964,514

(22) Filed: Aug. 12, 2013

(65) Prior Publication Data
US 2014/0044268 A1    Feb. 13, 2014

Related U.S. Application Data

(60) Provisional application No. 61/682,033, filed on Aug. 10, 2012.

(51) Int. Cl.
*H03G 3/20* (2006.01)
*H04R 29/00* (2006.01)
*H03G 7/00* (2006.01)

(52) U.S. Cl.
CPC ............... *H03G 3/20* (2013.01); *H03G 7/007* (2013.01); *H04R 29/00* (2013.01)

(58) Field of Classification Search
USPC .................................. 381/56, 106, 104, 107
See application file for complete search history.

(56) References Cited

U.S. PATENT DOCUMENTS

2009/0220109 A1* 9/2009 Crockett ............... H03G 3/3089
381/107
2013/0287227 A1* 10/2013 Wallander ........... G10L 21/0316
381/103

OTHER PUBLICATIONS

Skovenborg, Loudness Range—Design and Evaluation, Apr. 26-29, 2012, AES 132$^{nd}$ Convention http://www.tcelectronic.com/media/3363942/lra-design.pdf.*
Skovenborg et al., Loudness Descriptors to Characterize Programs and Music Tracks, Oct. 2-5, 2008, AES 125th Convention http://www.tcelectronic.com/media/1017481/loudnessdescriptors_aes125.pdf.*
Skovenborg, Loudness Range—Design and Evaluation, Apr. 26-29, 2012, AES 132nd Convention http://www.tcelectronic.com/media/3363942/lra-design.pdf.*

* cited by examiner

*Primary Examiner* — Duc Nguyen
*Assistant Examiner* — Yogeshkumar Patel
(74) *Attorney, Agent, or Firm* — Crowe & Dunlevy; Terry L. Watt

(57) ABSTRACT

According to a preferred aspect, there is provided a system and method for controlled dynamics adaptation of audio works. The dynamics complexity of the audio is adapted depending on the listening environment and its dynamics properties. The instant invention utilizes a function of stepwise linear and logarithmical sections, which describe individual points of a curve and which therefore with the use of a parameter can be utilized to calculate and control the target value of the loudness range. The curve points are stored and provided as metadata of the musical program, which allows the dynamics scaling functionality to be implemented dynamically and not tied to a certain time or place.

8 Claims, 3 Drawing Sheets

SYSTEM AND METHOD FOR CONTROLLED DYNAMICS ADAPTATION FOR MUSICAL CONTENT

This application claims the benefit of U.S. Provisional Patent Application Ser. No. 61/682,033, filed on Aug. 10, 2012, and incorporates said provisional patent application by reference into this document as if fully set out at this point.

FIELD OF THE INVENTION

The present invention relates generally to the field of professional audio mastering and consumer electronics.

BACKGROUND

In recent years the topic of "loudness" has increasingly drawn the attention of broadcasting corporations.

Heretofore, the acoustical parameter that has been most commonly used to describe the volume of an audio signal has been the signal's maximum or peak audio level (maximum program peak). The maximum (peak) amplitude of a signal has been a popular measure because it is proportional to the maximum sound pressure level when the signal is played back. Those of ordinary skill in the art will appreciate, though, that such a measure may not properly characterize the perceived volume of the associated audio signal.

The fact that, psycho-acoustically, music that is perceived to be louder gets more attention has been, and continues to be, increasingly exploited. This has predictably led to instances where music providers, radio stations, producers seek to push their own musical content more into the foreground by increasing its volume. Thus, one negative side effect has been an increased competition between radio stations, individual music titles, commercials etc., to secure the highest loudness which has led to degradation in the overall audio quality. This is because, among others, such strong fluctuations in loudness are unpleasant to a listener. Additionally, the increase in loudness at a constant maximum peak level demands dynamics compression, which, when used intensely, leads to pumping noise (e.g., gain pumping can occur after a regularly occurring high amplitude transient such as a kick drum), distortion and other sound artifacts.

Because of this the ITU (International Telecommunications Union), the EBU (European Broadcast Union) and the ATSC (Advanced Television Systems Committee, Inc., ATSC A/85 is incorporated by reference herein) have published guidelines that are directed to standardizing methods for the determination of the loudness and which provide the parameters/values for the distribution of audio programs for broadcast (ITU-R BS.1770, and EBU R128 attached hereto as Appendices A, and B, respectively, and incorporated fully herein by reference as if set out at this point). In the USA the harmonization of the loudness measurements has additionally been mandated by legislation (CALM-Act) and via implementation of standard A/85. In coming years it is to be expected that these standards will be enforced worldwide and that commercial audio content will either be produced according to these standards and existing audio content will be adapted to comply with same.

The change in the leveling paradigm from program peak normalization to program loudness normalization affects all stages of an audio broadcast signal, from production to distribution and transmission. The ultimate goal is to harmonize audio loudness levels to achieve an equal universal loudness level for the benefit of the listener. Loudness level need not be at all times constant and uniform within a program. Program loudness normalization shall ensure that the average loudness of the whole program is the same for all programs. Loudness normalization achieves equal average loudness with the peaks varying depending on the content as well as on the artistic and technical needs. This does not mean that within a program the loudness level must be constant. Nor does it mean that individual components of a program all have to be at the same loudness level. Instead, the average, integrated loudness of the whole program is normalized.

Because of the required constant loudness, the typical reason for dynamics compression no longer applies. To control the dynamics scope in EBU R128, dynamics are specified in parallel with the loudness value via the measure Loudness Range, which is abbreviated as "LRA". Loudness Range measures the variation of loudness on a macroscopic scale in units of "LU"—Loudness Units. Loudness Range quantifies the variation in time-varying loudness measurement and is supplementary to the main audio measure Program Loudness of ESU R128. The computation of Loudness Range is based on a measurement of loudness level as specified in ITU-R BS. 1770. The measure Loudness Range is used to help decide if and how much dynamic compression is needed (dependent on genre, target audience and transmission platform). In discussions about loudness, often the impression is created that the greatest possible dynamics automatically leads to better audio quality. However the dynamics is heavily dependent on the listening situation and environment.

The computation of Loudness Range is based on the statistical distribution of measured program loudness, so that short, but very loud, events will not affect the Loudness Range of a longer program. The range of the distribution of loudness levels is determined by estimating the difference between a low and a high percentile of the loudness distribution. Loudness Range additionally employs a cascaded gating method to take into account types of programs that may be, overall, very consistent in loudness, but that have some sections with very low loudness. Without gating, such programs would incorrectly get quite a high Loudness Range measurement, due to the relatively large difference in loudness between the regions of background and those of normal foreground loudness.

The situations and environments in which audio is being listened to can vary widely. For example, consider the differences in listening environments such as the movie theatre, the home theatre, the living room, the kitchen, late at night at home, walking along a street, in the car and in an airplane. As can be readily seen by reference to the foregoing, the locations that involve the most challenging listening environments (e.g., via mp3 player, in a car, train, airplane, stores, etc.) are also the locations where audio tends to be regularly consumed. This is reasonable because in these sorts of locations often the user is occupied with visual tasks (e.g., driving) so the use of audio alone may be preferred. Therefore, in such situations it would be important to adapt audio content to the lower dynamic complexity in these environments. On the other hand it is not desirable to completely eliminate dynamics and the associated higher sound quality in quieter environments.

The EBU is proposing the use of a compressor (EBU R128 3343) to limit dynamics. A compressor in general, however, has the disadvantage that its time constants are not definable independent from the content of the program. Furthermore, its functionality can only be utilized in a delayed fashion in systems with low latency (e.g. radio). The time constants may need to be relatively long (e.g., in the case of a leveler rather than a compressor). Both approaches can lead to a result which in itself is not optimal, because artifacts created by the compressor are noticeable to the listener.

Furthermore, the Dolby AC-3 codec includes compression presets that cause the encoder to generate different gain control words that are sent in the bitstream to the consumer's decoder: e.g., Film Standard, Film Light, Music Standard, Music Light, Speech and None. The transmission of gain-words is applied to reduce the dynamic range of the signal either by default or after user activation. This approach provides generic dynamic range compression curves that are to be applied to individual audio programs, without consideration of the audio program itself and its listening environment.

Thus, what is needed is a method of adjusting the loudness range of an audio program in response to environmental/background noise level changes that provides less "pumping", offline processing, an option to adapt to the surrounding noise levels, scalability, an approach that is readily and easily implementable, and an approach that is directly tuned to the particulars of the audio content of the program that is being heard.

Heretofore, as is well known in the media editing industry, there has been a need for an invention to address and solve the above-described problems. Accordingly it should now be recognized, as was recognized by the present inventors, that there exists, and has existed for some time, a very real need for a system and method that would address and solve the above-described problems.

Before proceeding to a description of the present invention, however, it should be noted and remembered that the description of the invention which follows, together with the accompanying drawings, should not be construed as limiting the invention to the examples (or preferred embodiments) shown and described. This is so because those skilled in the art to which the invention pertains will be able to devise other forms of the invention within the ambit of the appended claims.

SUMMARY OF THE INVENTION

There is provided herein a system and method for replacing the proposed functionality of the standard audio compressor with an approach that provides for continuous control of the output volume, with the functionality of the instant invention being controllable by one or more parameters. These gain functions will be called volume automation curves herein ("VAC"). For controlling the LRA (i.e., Loudness Range) value according to EBU R128 3342, an algorithm is taught herein which will be utilized to control the volume of an audio program. This function is scalable via a factor and, thus, the function can be adapted to at least approximately match a target value of the dynamics complexity (LRA-value).

In an embodiment, the volume automation curve will preferably be described by piece wise linear or logarithmical (dB-linear) sections. That is, preferably the endpoints of the volume automation curve in in one time window will coincide with those in adjacent windows. Thus, the volume automation curve will need to be continuous and at least approximately coincide in value at the intersection between adjacent windows, else there could be volume discontinuities when the audio work is compressed or expanded. Thus, for purposes of the instant disclosure, when the term "continuous" is used to describe a volume automation curve, expansion curve, or other curve that term should be understood to mean that the functional values in adjacent windows should be at least approximately equal at the change point locations as is shown generally in FIG. 4.

The end points of the sections as defined by the change points will define points of this function and their values, with the curve point values being indicative of the amplitude of the curve at that point. These curve points/curve point values can be stored as metadata along with the subject audio program and independent from the program's own metadata, like genre information, title information etc. If the audio program is transmitted or stored together with the VAC metadata, a subsequent scaling in an end-user device, during broadcast, streaming or during the generation of an adapted distribution media is potentially possible by the instant invention. Thus, the desired dynamics, as well as the desired LRA-value, are most likely to be experienced by the end user.

One advantage for the content producer is that the instant invention provides a means of controlling the dynamics values manually, semi-automatically or automatically. Additionally, in some embodiments, it will be possible to take into account the inherent metadata attributes, like title, artist, album, genre, year, etc. of the audio program (or not). In an embodiment, it will be possible for the producer to adapt the automatically generated data to for example, manually define transitions between different dynamics sections as being explicitly hard or soft. The control of the dynamics complexity is, thus, not random or generalized—it is under control of the producer. The advantage for the manufacturer of consumer devices would be the easy implementation of such an approach and the associated lower costs of hardware. It will be possible to integrate the functionality of such a dynamics control approach directly into an audio decoding process.

An additional advantage for the producer will be the possibility of optionally adapting the dynamics values in real time and continuously according to the environment in which the program will be heard. For example, in a car, or more generally in traffic, the environmental noise can fluctuate widely. To automatically raise the overall volume (e.g., via automatic gain control) could be counter-productive for a number of reasons. First, the noise level may be transient (e.g., a noise increase while going over a short span of rough pavement) and such a volume level adjustment might result in unpleasant volume levels. In other instances, a substantial increase in volume could actually be damaging to a listener's hearing.

One problem with the conventional approach is that changes in the environmental noise level are compensated by an overall adjustment in the volume level. This approach does not acknowledge or take advantage of the fact that an audio program may be composed of some combination of louder and softer signals. What would be preferable in many cases, of course, would be to leave loud signals as they are and adjust the loudness of the softer signals.

The foregoing has outlined in broad terms the more important features of the invention disclosed herein so that the detailed description that follows may be more clearly understood, and so that the contribution of the instant inventors to the art may be better appreciated. The instant invention is not limited in its application to the details of the construction and to the arrangements of the components set forth in the following description or illustrated in the drawings. Rather the invention is capable of other embodiments and of being practiced and carried out in various other ways not specifically enumerated herein. Additionally, the disclosure that follows is intended to apply to all alternatives, modifications and equivalents as may be included within the spirit and the scope of the invention as defined by the appended claims. Further, it should be understood that the phraseology and terminology employed herein are for the purpose of description and should not be regarded as limiting, unless the specification specifically so limits the invention.

BRIEF DESCRIPTION OF THE DRAWINGS

Other objects and advantages of the invention will become apparent upon reading the following detailed description and upon reference to the drawings in which.

DESCRIPTION OF THE PREFERRED EMBODIMENTS

Figure 1:
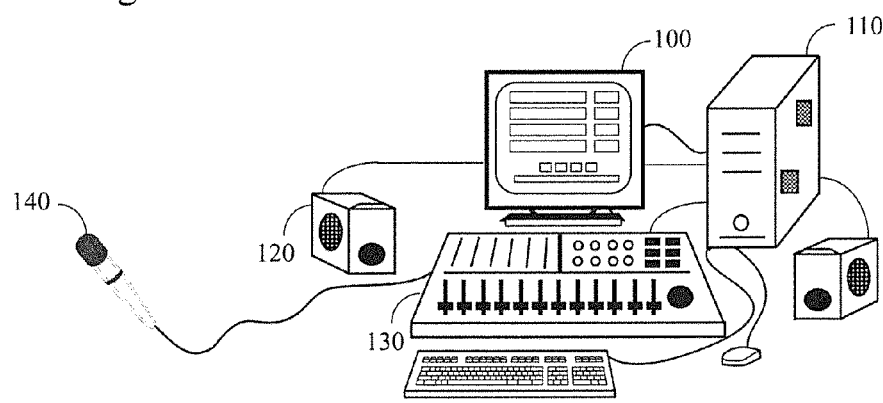
FIG. 1 depicts a general working environment of an embodiment of the instant invention.

Referring now to the drawings, wherein like reference numerals indicate the same parts throughout the several views, there is provided a preferred system and method for controlled dynamics adaptation for musical content.

As is generally indicated in FIG. 1, at least a portion of the instant invention will be implemented in form of software running on a personal or other computer 110, the computer preferably being used as a digital audio workstation. Such a computer will have some amount of program memory and nonvolatile storage (e.g., magnetic disk, flash RAM, etc.), whether internal or accessed via a network, as is conventionally utilized by such units. Furthermore a display device 100 will preferably be attached to the computer 110 so that visual information can be provided to the user. Preferably, the display device will be a TFT-display (i.e., "thin film transistor" display), although that is not a requirement. Additionally it should be noted that it is common to use multiple display devices in order to provide the user with additional screen real estate which can be very useful when doing audio and other types of editing. As such, when the term "display device" is used herein, that term should be understood to mean one or more physical display devices.

Additionally, in the realm of professional or amateur audio editing it is common to have audio speakers 120 connected to the digital audio workstation 110, so that audio information can be auditioned and evaluated by the sound engineer. Preferably there will be at least two audio speakers 120 connected to the computer, although that is not a requirement. It is common in the professional audio editing environment to use five or more speakers plus one subwoofer. Of course, in some instances headphones might be used along with or instead of the speakers 120. Additionally, it is anticipated that a keyboard and mouse might be useful. In the audio editing environment, a mixing console 130 might also be connected to the computer. This peripheral would permit the sound engineer to more efficiently access the individual functions and options of the digital audio workstation software installed on the computer 110. Additionally a microphone 140 might be connected to the workstation to record the ambient sound and sound level in different listening environments so that the instant invention can afterwards utilize the recorded data values into the process of the instant invention.

The instant invention will preferably provide for continuous control of the loudness range of an audio program through a time varying function. This function will be adjustable via the parameters provided, e.g., the instant invention will provide control via volume automation curves. The loudness range value of a particular audio program will be controlled through the use of an algorithm that provides this function/curve for controlling the loudness range. The function and the associated curve will preferably be scalable through the use of a factor that manages and provides the desired dynamics complexity (Loudness Range).

In one embodiment, the algorithm provides a function/curve, which is preferably segmented into piecewise linear or logarithmical sections. The borders of these sections represent curve points that might be stored as meta data, preferably together with the associated audio program. The generated curve can be utilized by the instant invention in at least two distinct ways. Additionally, in some embodiments the two approaches could be combined.

In a first preferred embodiment the curve might be distributed together with the audio work, with the audio work containing the full loudness range and being uncompressed. The curve might then be used to compress the audio program during the replay situation, whether through an end user device, during broadcast, streaming or when generating a program. In the second preferred embodiment, the audio work might be transmitted in a compressed form, with the loudness range being compressed and by using the curve, the full loudness range of the audio program can be recovered, wherein the curve will be used as an expansion curve and therewith the instant invention will recover more nearly the dynamics level of the original when played thereafter, whether through an end user device, during broadcast, streaming or when generating a program.

Figure 2:
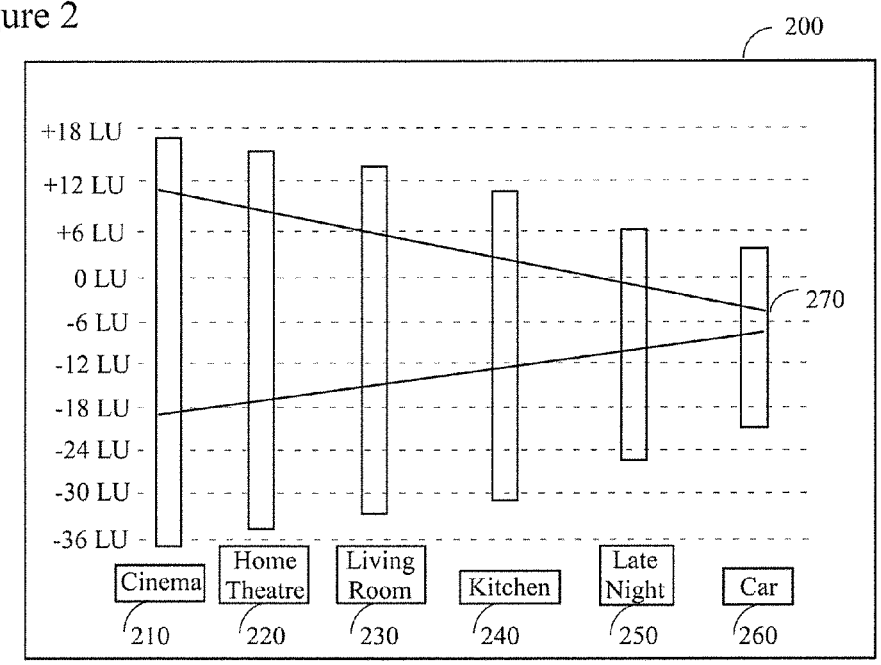
FIG. 2 illustrates differences in dynamics depending on the playback situation and location.

Turning next to FIG. 2, this figure contains a schematic illustration of the dynamics range of an audio program in different environments. When the same audio program is played in different listening environments, it will be perceived differently because of background noise and the acoustics of that environment, etc. For example, in a cinema/theater setting where the room is typically specifically configured for audio, the full details of the dynamics range of the audio program will generally be perceivable. On the other hand, in an environment such as an automobile, where the environment is not particularly well designed for acoustics and where background noise is a constant issue, the perceptibility of the details of the program will usually be greatly curtailed.

By way of further explanation, FIG. 2 depicts an example of the sorts of loudness ranges that might be encountered in different listening environments and measured in loudness units. As has been previously mentioned Loudness Range is a measure to supplement loudness normalization in accordance with standard EBU R128, which is incorporated by reference in its entirety into this description. Loudness Range quantifies the variation in a time-varying loudness measurement. It measures the loudness on a macroscopic time-scale in units of LU (Loudness Units), which are believed to be more representative of the perceived loudness of a signal than the maximum peak level in dB (decibel) scale.

The computation of Loudness Range is based on the statistical distribution of measured loudness. Short, but very loud events would not affect the Loudness Range of a longer segment. The range of the distribution of the loudness levels is determined by estimating the difference between a low and a high percentile of distribution. Loudness Range furthermore employs a cascaded gating method, primarily to take into account types of programs that may be, overall, very consistent in loudness, but that have some sections with very low loudness. Without gating, such programs would incorrectly get quite a high Loudness Range measurement, due to the relatively large difference in loudness between the regions of background noise and those of normal foreground loudness.

FIG. 2 depicts the fact that different listening environments feature a higher potential range in dynamics (Loudness Range) than others. Therefore a plurality of listening environments require strong or very strong compression to adapt the program to the different Loudness Ranges without losing the higher loudness range and the associated higher quality of the program in other listening environments. FIG. 2 illustrates a potential loudness range from +18 LU to −36 LU and it furthermore shows that the loudness range of different listening environments is shrinking from the movie theatre, over the home theatre, to the living home, the kitchen, late night and to the car. The movie theatre, from all the listed listening environments provides the highest loudness range (defined by the line 270), whereas the loudness range in a car 260 is considerably smaller.

In view of the foregoing, it should be clear that a better approach to a general adjustment in the volume would be to adapt the gain of the audio material dynamically and differently in different sections to match the environment and the listening situation.

Figure 3:
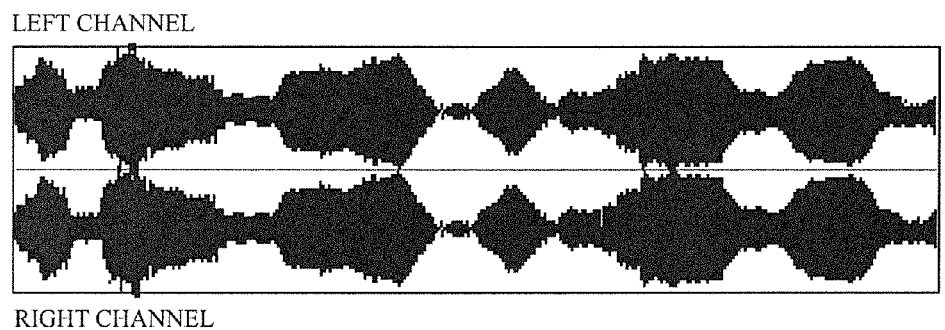
FIG. 3 depicts a graphical display of the loudness range of a musical recording according to the instant invention at 18 loudness units.

Turning now to FIG. 3, this figure contains a schematic representation of the Loudness Range of a typical stereo music program. As can be seen the volume of this audio program is complex and varies markedly over time as is typical of recorded music. Further, in this example this audio program was produced according to the conventional approach which seeks to create a musical performance that has a dynamics range that is a high as possible to create a relatively good experience in a wide variety of listening environments. However, the dynamics range (gain) compression that might be applied to such a recording does not take into account the audio material and does not consider where and how it might subsequently be played, including the environment in which the music might be experienced. Those of ordinary skill in the art will recognize that dynamics range compression reduces an audio signal's dynamics range by reducing the volume of loud sounds and/or amplifying the level of quiet sounds.

Currently there are two popular algorithms for audio compression: downward compression that reduces loud sounds over a certain threshold while quiet sounds remain unaffected; and, upward compression which increases the loudness of sounds below a threshold while leaving louder passages unchanged. Both approaches reduce the total dynamics range of an audio signal. Obviously, among the parameters that are available in such an approach are the threshold level(s) and the amount of gain reduction (or amplification) that is applied to that portion of the audio signal that lies outside of the upper or lower threshold.

Figure 4:
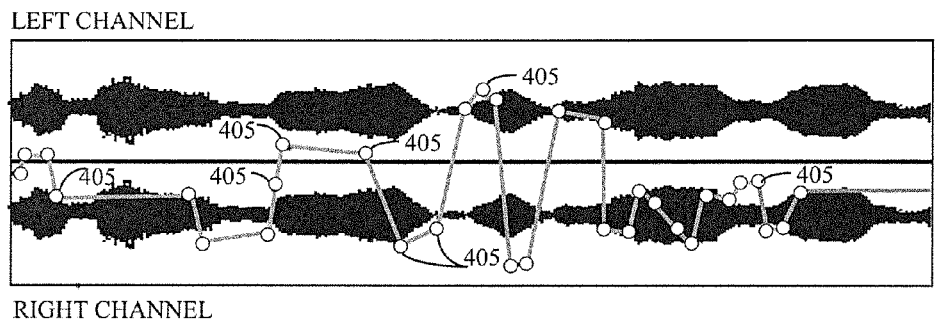
FIG. 4 depicts a graphical display of the loudness range of a musical recording according to the instant invention at 12 loudness units.

According to an embodiment of the invention, there is provided a method of producing audio programs that does not suffer from the limitations of the prior art. As is generally indicated in FIG. 4, the instant invention operates generally as follows.

Figure 5:
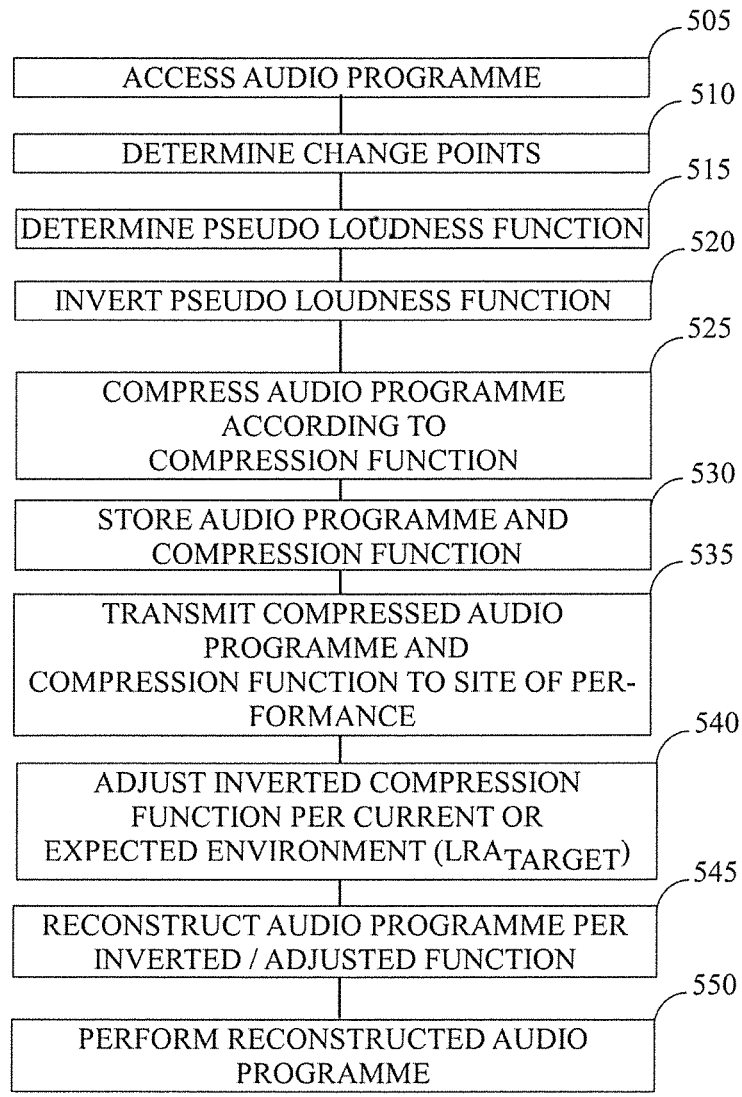
FIG. 5 contains a high-level logic schematic suitable for use with the instant invention.

First, a digital audio work will be accessed and analyzed (step 505) and a number of change points 405 will be determined and selected (FIG. 5, step 510.) The change points define, in effect, a series of time windows in within the audio work. The change points are endpoints of a curve and will be determined by using a technique such as loudness measuring of the audio material. That is, the change point locations might be based on an analysis of the audio content of the program. In some embodiments, it might be possible to utilize the metadata of the audio work to adapt this determination, for example use of a shorter analysis window for speech audio material. In addition to the automatic and semi-automatic approaches mentioned above, it is also possible that the user might be able to manually fully edit and therewith generate the curve (e.g., the curve endpoints) and, additionally, it might also be possible that the user will be able to select and change sections of the automatically generated curve individually, thereby overriding an automatic analysis result. In an embodiment, an adapted reverse function of the short term based function from the loudness metering described in EBU Tech 3341 will be used, which is supplementary information for standard EBU R 128. This supplementary information regarding the short term function is incorporated in its entirety in this application. The short term function is a function that preferably features a sample rate of at least 1 Hz (k$\Delta$t with $\Delta t \leq 1$ Hz).

In some embodiments a loudness analysis will be performed on the digital audio work, wherein a filtering and integration step is introduced according to ITU BS.1770. Preferably the short term function (k$\Delta$t) according to EBU R128 will be used to determine integration constants. In an embodiment, the complete loudness analysis will be the starting point for the determination of the Loudness Range (LRA) according to EBU R128 Tech 3342. Preferably, the analysis window length, the time constant, will be about three seconds, sampled every second although other variations are certainly possible. However, depending on the metadata of the audio work, or the type of the audio work, it might be sensible to adjust the analysis window length. As an example, when speech is detected, or a specific genre metadata value is detected, a shorter window length might be preferable.

To initiate the next step of the instant invention an adapted reverse function of the short term function will preferably be implemented in this embodiment. The inverse Short Term function is represented by $$\mathrm{InvShortTerm}(k) = A / \mathrm{ShortTerm}(k),$$

where the parameter A is obtained by calculation for each individual audio work. A represents the measured loudness of the audio work. A number of possible automatic corrections might also be applied to the result of the inverse short term function. For example, an additional straightening of the curve of the function might be performed, or an additional determination of music fade in and fade out sections in the audio (e.g., to exclude the intro from the calculation), and the identification of speech after a fade out, might be applied.

In some embodiments a function will be calculated by using the short-term function from the loudness metering as described in EBU Tech 3341. According to an embodiment, the instant gain function will be calculated and utilized by:

(1) Determining the short-term function as described in EBU Tech 3341;
(2) Determining an inverse of this function and storing the individual curve points e.g., at least the location and amplitude of the change points;
(3) Providing the curve data to producers who will then be able to adapt the dynamics, the Loudness Range specifically for the audio program by using a parameter provided for that purpose. This parameter might be utilized as part of a plurality of individual presets—with these presets preferably directed to provide a desired loudness range, for example 6 LU.

Alternatively, the parameter might be selected by the producer himself, taking into account measures appropriate and preferably taken from the listening environment. Generally, the parameter will preferably be set manually when the values of the listening environment change. This can be utilized during the production phase of creating the audio program to tailor the instant curve to match the audio to the anticipated listening environment. However, it is also possible that the curve will be transmitted along with the audio program to the user and utilized during playback.

In an embodiment, the inverse curve will be scaled with the selectable compression parameter/compression factor 1/D. With this factor/parameter it will be possible to get to the target value for the loudness range (LRA) wherein D is at least approximately equal to:

$$D \cong LRA_{current}/LRA_{target}$$

In some embodiments, $LRA_{target}$ will be selected based on the acoustics that are expected to be encountered when the audio is performed at a remote location. Instances where this approach might be appropriate would include theaters, auditoriums, stadiums, and other venues that have relatively predictable acoustics. In other cases, typical values of $LRA_{target}$ might be determined for interior spaces such as living rooms, kitchens, autos, etc. In still other embodiments a user at the remote location might be asked to attach one or more microphones to a local computer so that an $LRA_{target}$ can be determined based on the actual acoustics and ambient noise. In still other embodiments, a local microphone might be used to continuously or periodically test the current ambient conditions and modifying $LRA_{target}$ accordingly. This would provide near real-time optimization of the audio signal based on the current listening conditions and allow time varying adjustments (e.g., when the audio is played in a moving auto).

In professional audio editing it is more common to work and specify with the reciprocal compression factor rather than the mathematically more relevant expansion factor. In some embodiments, an inverse curve will be calculated using the forward (short-term function) curve and the selected parameter value(s), wherein the under sampled curve points k are preferably linearly interpolated according to the sample rate. The calculated short-term curve (potentially as modified by the producer by variation of the one or more parameters) will then preferably be applied to the audio. The inverse curve will then preferably be stored along with the audio so that a playback of the subject work can be properly reconstructed using the inverse curve.

Next, according to an embodiment and given the collection of change points 405 in FIG. 4, a pseudo loudness function will preferably be determined (step 515) that consists of linear (or logarithmic) sections that are each bound by one of the change points 405. In some embodiments, the curve between the change points 405 will be piecewise linear, the line segments between the change or curve points being determined by successive change points. The pseudo loudness function represents the loudness values of the audio over time. The pseudo loudness function will need to be inverted, which will be carried out in a next preferred step 520. This inversion will produce a compression function that will be utilized further by the instant invention.

Next, and preferably, the audio will be compressed according to the compression function (step 525). In some embodiments, the compression function will be multiplied sample-by-sample by the digital audio program. Other embodiments might divide the audio by the compression function, etc. That being said, all that is required is that the compression function be mathematically applied to the audio data to adapt its dynamic range. This will result in an output audio product that has relatively constant peak amplitude throughout its entire length.

In some embodiments, the compressed audio and compression function will be stored (step 530). Preferably, the compression function will be stored as calculated metadata along with the audio work. The compression function might be stored as a separate file.

Next, the audio work and the associated compression function will preferably be transmitted to the site of the performance (step 535). As was indicated above, in some instances this transmission will only contain the single file that contains the audio data and its previously calculated metadata. In other embodiments, the two files that were stored according to step 530 will both be transmitted. In further another embodiment it might also be possible that the two files might be transmitted independently of each other including, for example, instances where the files were transmitted at different times.

Next, in one embodiment the instant invention will adjust the inverted compression function to at least approximately match the value of $LRA_{target}$ (step 540) as has been described previously.

Next, in an embodiment the audio will be reconstructed using the inverse and adjusted compression function (step 550). Depending on how the compressed audio was created, it would normally be expected that the inverse mathematical operation would be applied to the compressed signal using the compression function to recover the original signal. With this approach it is possible to transmit the compressed signal and to generate a higher dynamics with the use of the compression function, thereby adapting the listening experience for older devices to a lower loudness range and for newer devices with the original higher loudness range.

Finally, the reconstructed audio program will be performed (step 555), typically by playing it through one or more loud speakers or via a user's headphones, etc. Note that in some embodiments, the reconstructions (step 550) will be performed in real-time as the audio program is performed. Thus, it may be the case that the entire work is never uncompressed at any one moment but, instead, only sections of the work will be uncompressed as needed.

Additional details of various aspects of the instant invention and/or additional background re same may be found in the appendices attached hereto, the disclosures of which are incorporated by reference herein as if fully set out at this point.

CONCLUSIONS

Of course, many modifications and extensions could be made to the instant invention by those of ordinary skill in the art. For example, in one preferred embodiment a software solution could be provided that instantaneously adapts the dynamics level of pre-analyzed musical content, either directly in the software itself stationary on a personal computer or directly in a handheld computer device to the current environment. The noise level of the environment and in connection with that, the available dynamics can be measured with the microphone of a mobile handheld device and that measured values could then be dynamically used in the adaptation.

Thus, the present invention is well adapted to carry out the objects and attain the ends and advantages mentioned above as well as those inherent therein. While the inventive device has been described and illustrated herein by reference to certain preferred embodiments in relation to the drawings attached thereto, various changes and further modifications, apart from those shown or suggested herein, may be made therein by those of ordinary skill in the art, without departing from the spirit of the inventive concept the scope of which is to be determined by the following claims.

What is claimed is:

1. A method of performing a digital audio work, comprising the steps of:
    (a) accessing said digital audio work;
    (b) determining a plurality of change points within said audio work, wherein each of said plurality of change points represents an amplitude of an expansion curve at a different point in time within said audio work;
    (c) using said plurality of change points to determine a continuous expansion curve without jumps or gaps for said digital audio work that coincides in amplitude with each of said plurality of change point amplitudes;
    (d) using said expansion curve to scale said digital audio work, thereby creating a scaled digital audio work;
    (e) transmitting said scaled digital audio work and said expansion curve to a user at a user location;
    (f) selecting $LRA_{target}$, wherein $LRA_{target}$ is a target loudness range;
    (g) selecting $LRA_{current}$, wherein $LRA_{current}$ is a loudness range associated with said digital audio work;
    (h) calculating $D = LRA_{current}/LRA_{target}$, wherein D is a compression parameter;
    (i) using said expansion curve and utilizing the compression parameter 1/D to at least approximately recover said digital audio work from said scaled digital audio work; and,
    (j) performing said at least approximately recovered digital audio work for the user at the user location.

2. A method of performing a digital audio work according to claim 1, wherein said plurality of changes points are determined either automatically, semi-automatically or manually.

3. A method of performing a digital audio work according to claim 1, wherein said audio work is selected from the group consisting of streamed audio material, an audio component of streamed video material, an audio file, and an audio component of a video file.

4. A method of performing a digital audio work according to claim 1, wherein step (b) comprises the steps of:
    (b1) performing a loudness measuring analysis on the audio work;
    (b2) determining a plurality of change points from said loudness measuring analysis.

5. A method of performing a digital audio work, comprising the steps of:
    (a) accessing said digital audio work;
    (b) determining a plurality of non-overlapping time windows within said audio work, wherein
        (i) said plurality of windows taken together cover said audio work, and,
        (ii) a starting time of each of said plurality of windows coincides with an ending time of an adjacent one of said plurality of windows;
    (c) selecting a change point within each of said plurality of windows, thereby selecting a plurality of change points, each of said plurality of change points being associated with an audio gain value;
    (d) using said plurality of change points to determine a continuous expansion curve for said digital audio work, said expansion curve coinciding in amplitude with each of said plurality of change point gain values,
        wherein said continuous expansion curve comprises a plurality of connected line segments, each of said plurality of line segments having a first end point at a first one of said change points and a second end point at an adjacent one of said change points, and, wherein said plurality of line segments taken together form a continuous amplitude curve;
    (e) using said expansion curve to scale said digital audio work, thereby creating a scaled digital audio work;
    (f) transmitting said scaled digital audio work and said expansion curve to a user at a user location;
    (g) selecting $LRA_{target}$, wherein $LRA_{target}$ is a target loudness range;
    (h) selecting $LRA_{current}$, wherein $LRA_{current}$ is a loudness range associated with said digital audio work;
    (i) calculating $D = LRA_{current}/LRA_{target}$, wherein D is a compression parameter;
    (j) using said expansion curve and said compression parameter to at least approximately recover said digital audio work from said scaled digital audio work at a location of the user; and,
    (k) performing said at least approximately recovered digital audio work for the user at the user location.

6. A method of performing a digital audio work according to claim 5, wherein said plurality of changes points are determined either automatically, semi-automatically or manually.

7. A method of performing a digital audio work according to claim 5, wherein said audio work is selected from the group consisting of streamed audio material, an audio component of streamed video material, an audio file, and an audio component of a video file.

8. A method of performing a digital audio work according to claim 5, wherein step (d) comprises the steps of:
    (d1) performing a loudness measuring analysis on the audio work;
    (d2) using said loudness measuring analysis to determine said expansion curve amplitude at each of said change points.

* * * * *